(12) United States Patent
Akasaka et al.

(10) Patent No.: US 8,759,828 B2
(45) Date of Patent: Jun. 24, 2014

(54) ZNO-BASED SEMICONDUCTOR DEVICE AND MANUFACTURING METHOD THEREOF

(75) Inventors: Shunsuke Akasaka, Kyoto (JP); Masashi Kawasaki, Sendai (JP); Atsushi Tsukazaki, Sendai (JP)

(73) Assignees: Rohm Co., Ltd., Kyoto (JP); Tohoku University, Miyagi (JP)

( * ) Notice: Subject to any disclaimer, the term of this patent is extended or adjusted under 35 U.S.C. 154(b) by 43 days.

(21) Appl. No.: 13/445,593

(22) Filed: Apr. 12, 2012

(65) Prior Publication Data

US 2012/0261658 A1    Oct. 18, 2012

(30) Foreign Application Priority Data

Apr. 13, 2011 (JP) .................................. 2011-089002

(51) Int. Cl.
*H01L 29/22*    (2006.01)

(52) U.S. Cl.
USPC .............. 257/43; 438/104; 438/158; 438/478

(58) Field of Classification Search
CPC ........................................................ H01L 29/22
USPC ........................................................... 257/43
See application file for complete search history.

(56) References Cited

U.S. PATENT DOCUMENTS

| | | | |
|---|---|---|---|
| 6,674,098 B1 * | 1/2004 | Niki et al. .................. 257/102 |
| 7,105,868 B2 * | 9/2006 | Nause et al. .................. 257/192 |
| 7,402,506 B2 * | 7/2008 | Levy et al. .................. 438/584 |
| 7,690,727 B2 * | 4/2010 | Fischer et al. .............. 297/284.4 |
| 7,741,637 B2 * | 6/2010 | Nakahara et al. ............... 257/43 |
| 7,824,955 B2 * | 11/2010 | White et al. .................. 438/104 |
| 8,084,764 B2 * | 12/2011 | Komada ......................... 257/14 |
| 8,354,664 B2 * | 1/2013 | Moon et al. ..................... 257/13 |
| 2004/0164314 A1 * | 8/2004 | Nakahara ...................... 257/103 |
| 2004/0227150 A1 * | 11/2004 | Nakahara ...................... 257/103 |
| 2008/0187776 A1 * | 8/2008 | Nakahara et al. ............. 428/656 |
| 2008/0283863 A1 * | 11/2008 | Nakahara ........................ 257/99 |
| 2009/0146541 A1 * | 6/2009 | Nakahara et al. ............. 313/113 |
| 2009/0200545 A1 * | 8/2009 | Nakahara et al. ............... 257/43 |
| 2010/0102309 A1 * | 4/2010 | Nakahara et al. ............... 257/43 |
| 2010/0127255 A1 * | 5/2010 | Allen et al. ..................... 257/43 |
| 2010/0289004 A1 * | 11/2010 | Nakahara et al. ............... 257/15 |
| 2010/0308327 A1 * | 12/2010 | Nakahara et al. ............... 257/43 |
| 2011/0033718 A1 * | 2/2011 | Nakahara et al. ............. 428/457 |
| 2011/0049506 A1 * | 3/2011 | Rao et al. ........................ 257/43 |

(Continued)

FOREIGN PATENT DOCUMENTS

JP            4362635 B        8/2009

OTHER PUBLICATIONS

J.W. Elam et al, "Atomic layer deposition of palladium films on Al2O3 surfaces", Thin Solid Films 515 (2006) pp. 1664-1673.*

(Continued)

*Primary Examiner* — Kevin Parendo
*Assistant Examiner* — Charles N Ausar-El
(74) *Attorney, Agent, or Firm* — Rabin & Berdo, P.C.

(57) ABSTRACT

A ZnO-based semiconductor device includes an n type ZnO-based semiconductor layer, an aluminum oxide film formed on the n type ZnO-based semiconductor layer, and a palladium layer formed on the aluminum oxide film. With this configuration, the n type ZnO-based semiconductor layer and the palladium layer form a Schottky barrier structure.

19 Claims, 12 Drawing Sheets

(56) References Cited

U.S. PATENT DOCUMENTS

| | | | |
|---|---|---|---|
| 2011/0101342 A1* | 5/2011 | Kim et al. | 257/43 |
| 2011/0114938 A1* | 5/2011 | Nakahara et al. | 257/43 |
| 2011/0204355 A1* | 8/2011 | Suzuki et al. | 257/43 |
| 2012/0181531 A1* | 7/2012 | Nakahara et al. | 257/43 |

OTHER PUBLICATIONS

Grossner et al, "Palladium Schottky barrier contacts to hydrothermally grown n-ZnO and shallow electron states" Applied Physics Letters vol. 85, No. 12, Sep. 20, 2004, pp. 2259-2261.*

Schmidt et al, "Electrical characterization of ZnO, including analysis of surface conductivity" Applied Physics A 88; pp. 71-75 (2007).*

A. Diligenti and M. Stagi, "Tunnelling in Aluminum/Aluminum-Oxide/Palladium Junctions: Hydrogen-Induced Variations", Electronics Letters, vol. 19, Issue 18, Sep. 1, 1983, p. 717-718.*

H. C. Card et al., "Studies of tunnel MOS diode I. Interface effects in silicon Schottky diodes," J. Phys. D: Applied Physics, 1971, vol. 4, pp. 1589-1601.

Ghusoon M. Ali et al., "Effect of thermal treatment on the performance of ZnO based metal-insulator-semiconductor ultraviolet photodetectors," Applied Physics Letters, 97, pp. 031116-1-031116-3 (2010).

* cited by examiner

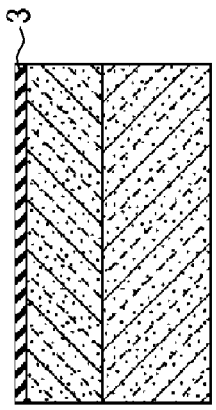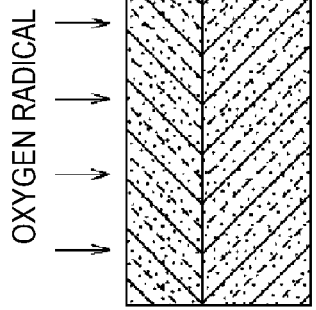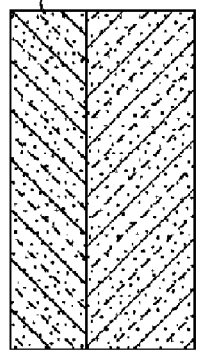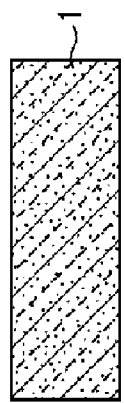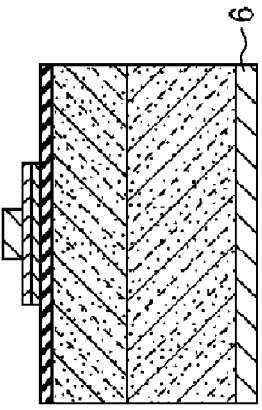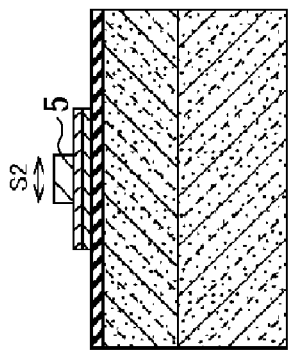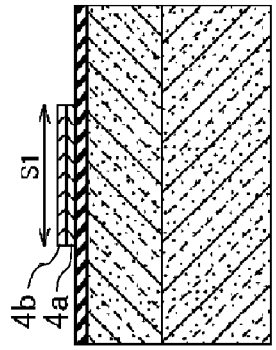

ZNO-BASED SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2011-089002, filed on Apr. 13, 2011, the entire contents of which are incorporated herein by reference.

TECHNICAL FIELD

The present disclosure relates to a ZnO-based semiconductor device having a Schottky barrier junction of metal and semiconductor and a manufacturing method thereof.

BACKGROUND

A conventional UV detection apparatus includes a photovoltaic type sensor device which detects UV light irradiating a light receiving area in response to a change in the flow amount of a photo-induced current. To this end, Si semiconductors having a detection sensitivity to visible light with a wavelength range from 400 nm to 750 nm have been considered in the related art because it reduces cost and can be easily doped. According to the light detection principle of a photovoltaic type sensor device, light having energy of a band gap or greater is irradiated upon a semiconductor of the light receiving area to generate electron/hole pairs, thus separating electrons and holes by a depletion layer, and supplying a current to an external circuit.

A photodiode is known as a photovoltaic type sensor device. Also, as mentioned above, photovoltaic type sensor devices are generally made of Si. Another type of photodiode is a Schottky junction type, in which Si directly contacts a metal electrode. The Schottky junction type is characterized in that the forward voltage drop is low and the switching speed is high. However, the Schottky junction type has a problem in that it produces a large reverse leakage current. For this reason, a metal insulator semiconductor (MIS) Schottky diode using Si has been proposed. This type of device employs a MIS Schottky diode having an Au/SiO2/Si structure.

Meanwhile, Si has sensitivity in a wavelength region of 1 μm or smaller, so it is difficult to extract only UV light in measuring the quantity of light. Therefore, in order to cut light other than UV light, a particular visible light/infrared light cut-off filter is required to be inserted.

Thus, an AlGaN semiconductor or ZnO semiconductor is considered as a semiconductor which is able to selectively absorb and detect only UV light, without using any filter.

Compared to the above devices, a photodiode including Si and a filter has high reliability but has a disadvantage in that it may deteriorate from strong UV irradiation. Further, although an AlGaN semiconductor may not deteriorate from UV irradiation, electron concentration therein is relatively high. Thus, when an AlGaN semiconductor is mass-produced, it may be difficult to take control of the dark current. Meanwhile, when employing a ZnO semiconductor, it has an advantage in that it may not deteriorate from UV irradiation. In addition, since the electron concentration is low, the dark current is stably suppressed.

Thus, for example, a MIS Schottky diode using a ZnO semiconductor is proposed. In this device, an MIS Schottky diode having an Au/Cr/SiO$_2$/ZnO structure is considered.

However, even for a MIS Schottky diode using ZnO, leakage current is not sufficiently restrained during reverse biasing. Further, there is room for improvement of electrical characteristics such as rectifying during forward biasing.

SUMMARY

The present disclosure provides some embodiments of a Schottky barrier type ZnO-based semiconductor device in which leakage current is further reduced and electrical characteristics are improved.

According to one aspect of the present disclosure, a ZnO-based semiconductor device includes an n-type ZnO-based semiconductor layer, an aluminum oxide film formed on the n-type ZnO-based semiconductor layer, and a palladium layer formed on the aluminum oxide film. With this configuration, the n-type ZnO-based semiconductor layer and the palladium layer form a Schottky barrier junction.

According to another embodiment of the present disclosure, a method includes exposing a surface of an n-type ZnO-based semiconductor layer to an oxide radical to treat the surface, forming an aluminum oxide film on the n-type ZnO-based semiconductor layer, after exposing a surface of an n-type ZnO-based semiconductor layer, and forming a palladium layer on the aluminum oxide film, after forming an aluminum oxide film. With this configuration, the n-type ZnO-based semiconductor layer and the palladium layer form a Schottky barrier junction.

BRIEF DESCRIPTION OF THE DRAWINGS

FIGS. 11A to 11G are views illustrating a process of manufacturing the ZnO-based device according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure(s). However, it will be apparent to one of ordinary skill in the art that the present disclosure(s) may be practiced without these specific details. In other instances, well-known methods, procedures, systems, and components have not been described in detail so as not to unnecessarily obscure aspects of the various embodiments.

Figure 1:
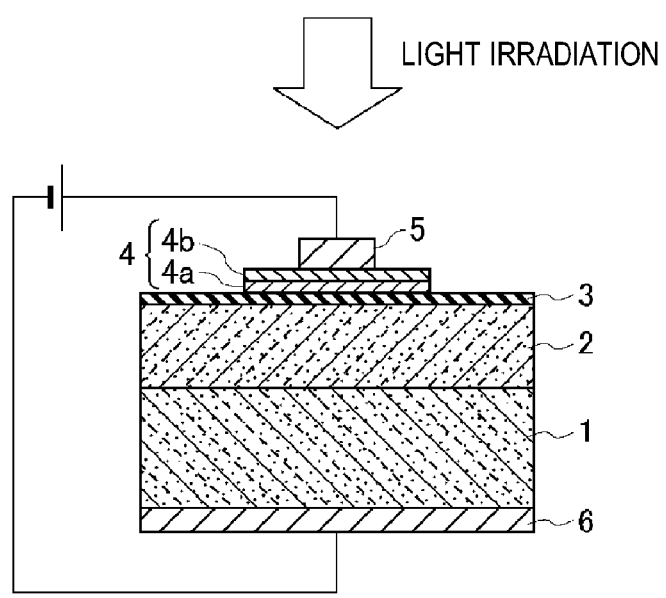
FIG. 1 is a sectional view illustrating a configuration example of a ZnO-based semiconductor device according to an embodiment of the present disclosure.

Exemplary embodiments of the present disclosure will now be described in detail with reference to the drawings. FIG. 1 shows an example of a sectional structure of a ZnO-based semiconductor device according to an embodiment of the present disclosure.

An n-type ZnO-based semiconductor layer 2 is formed on a substrate 1, and an aluminum oxide film 3 is formed on the n-type ZnO-based semiconductor layer 2. Further, a metal electrode 4 is formed on the aluminum oxide ($AlO_X$) film 3. The metal electrode 4 has a multilayer film structure in which a gold (Au) layer 4b is stacked on a palladium (Pd) layer 4a. As mentioned above, the metal electrode 4 is a multilayer metal film of Pd/Au, but functions as a semi-transparent electrode. A pad electrode 5 is formed on the metal electrode 4. For example, the pad electrode 5 may have a multilayer film structure of Ni/Au in which a nickel (Ni) layer and an Au layer are sequentially stacked from below.

Meanwhile, a rear electrode 6 is formed on a rear surface of the substrate 1 such that it is opposed to the metal electrode 4. The substrate 1 is configured as a conductive substrate, and for example, an n-type ZnO substrate may be used as the substrate 1. The rear electrode 6 is made of, for example, aluminum (Al), etc., which is in contact with the n-type semiconductor. Other materials other than Al can be used as long as it can function as an ohmic electrode.

Here, a ZnO-based semiconductor substrate or a ZnO-based substrate made of ZnO or a compound including ZnO can be used as the substrate 1. More specifically, in some embodiments the ZnO-based semiconductor or the ZnO-based substrate includes oxides of each of a IIA group element and Zn, a IIB group element and Zn, or a IIA group element, IIB group element, and Zn, besides ZnO. As one example, the n-type ZnO-based semiconductor layer 2 is made of $(Mg_Y, Zn_{1-Y})O$ $(0 \leq Y<1)$.

The aluminum oxide film 3 formed on the n-type ZnO-based semiconductor layer 2 is equivalent to an insulating film, and the Pd layer 4a formed on the aluminum oxide film 3 is equivalent to a Schottky electrode. Since a work function of the Pd layer 4a is greater than the electron affinity of the n-type ZnO-based semiconductor layer 2, the Pd layer 4a and the n type ZnO-based semiconductor layer 2 with the aluminum oxide film 3 interposed therebetween form a Schottky barrier junction. Thus, the ZnO-based semiconductor device of FIG. 1 constitutes a Schottky barrier type device having a MIS structure.

In FIG. 1, the pad electrode 5 is connected to a positive (+) side of a DC power source and the rear electrode 6 is connected to a negative (−) side of the DC power source. In this state, the ZnO-based semiconductor device of FIG. 1 has a rectifying operation as a diode having the foregoing Schottky barrier junction, to which a forwarding bias is applied.

As shown in FIG. 1, when light is irradiated from above, light is absorbed into a depletion layer formed in the n-type ZnO-based semiconductor layer 2 and converted into a current, and this photocurrent is extracted from both ends of the pad electrode 5 and the rear electrode 6. That is, the n-type ZnO-based semiconductor layer 2 is equivalent to a light absorption layer.

Figure 2:
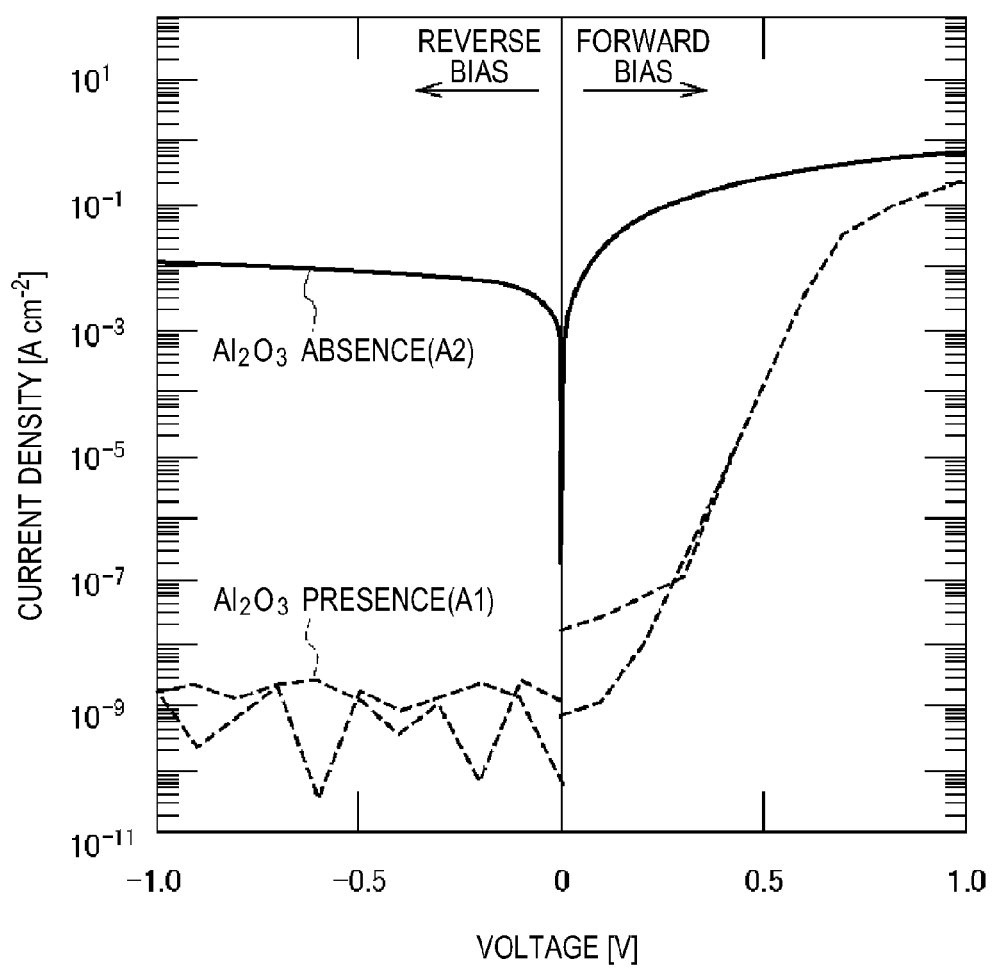
FIG. 2 is a view illustrating current-voltage characteristics of the device of FIG. 1.
Figure 3:
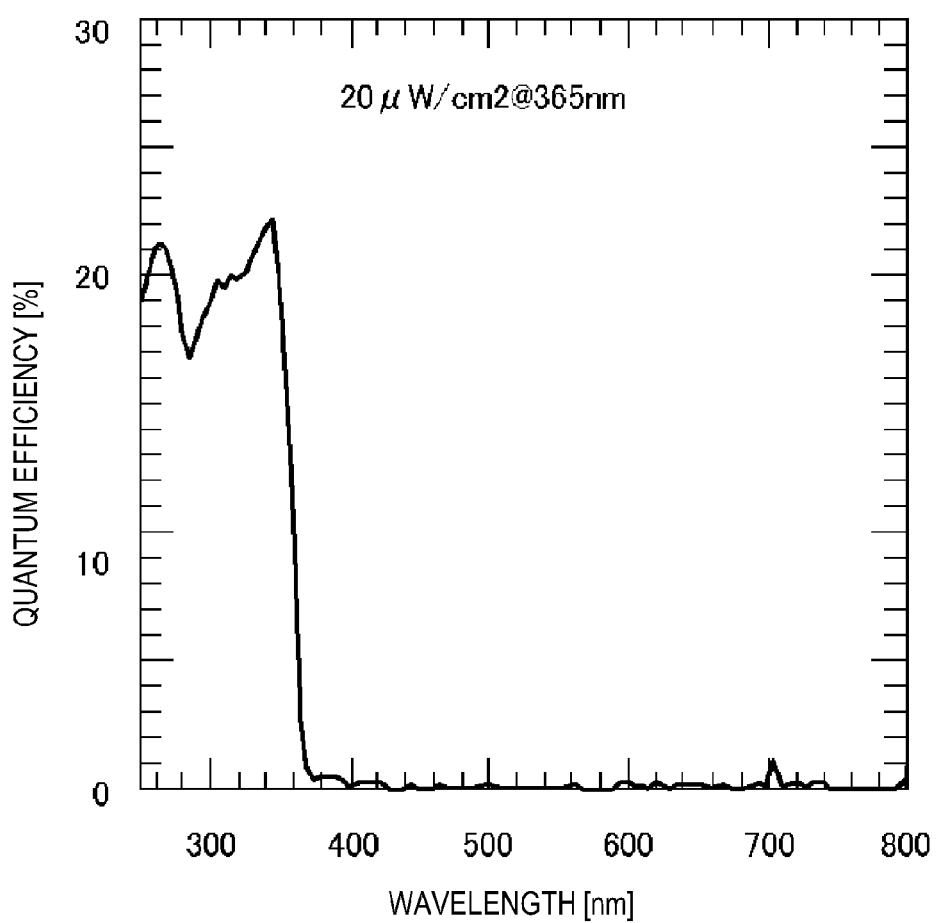
FIG. 3 is a view illustrating characteristics of spectral responsivity of the device of FIG. 1.

Next, the results obtained by measuring current-voltage characteristics (I-V characteristics) and the characteristics of spectral responsivity of the ZnO-based semiconductor device of FIG. 1 are shown in FIGS. 2 and 3. The substrate 1 is configured as an n-type ZnO substrate in which a stacked side plane is a +C plane. The n type ZnO-based semiconductor layer 2 is formed of an n-type $(Mg_Y, Zn_{1-Y})O$ $(0 \leq y<1)$, specifically, as an n type $(Mg_{0.1}, Zn_{0.9})O$ semiconductor layer (Y=0.1) having an electron concentration of $1 \times 10^{14}$ $cm^3$. The aluminum oxide film 3 is made of $Al_2O_3$ and has a film thickness of about 1 nm. Further, of the metal electrode 4, the Pd layer 4a is formed to have a film thickness of about 4 nm and the Au layer 4b is formed to have a film thickness of about 4 nm.

Also, as mentioned above, a surface of the side of the n-type ZnO substrate used in the substrate 1 in contact with the ZnO-based semiconductor layer 2 is configured to be a +C plane (0001). This is because a −C plane of the ZnO-based semiconductor is weak to acid or alkali and is difficult to be processed, in comparison to the +C plane.

The current-voltage characteristics in FIG. 2 are obtained by measuring a dark current in a state in which light is not irradiated to the ZnO-based semiconductor device of FIG. 1. Hereinafter, unless otherwise mentioned, the current-voltage characteristics are measured without light irradiation. In FIG. 2, A1 indicates I-V characteristics of configuration as shown in FIG. 1 by using the aluminum oxide film 3 made of $Al_2O_3$, and A2 indicates I-V characteristics of directly bonding the Pd layer 4a as a Schottky electrode to the n-type ZnO-based semiconductor layer 2 by eliminating the aluminum oxide film 3 in the configuration of FIG. 1, for comparison.

As for the voltage (V) indicated in the horizontal axis of FIG. 2, a + side voltage is a bias in a forward direction (hereinafter, referred to as a 'forward bias') and a − side voltage is a bias in a reverse direction (hereinafter, referred to as a 'reverse bias') based on 0 as a boundary. Further, the vertical axis of FIG. 2 indicates current density ($A/cm^{-2}$). As can be seen from FIG. 2, when the reverse bias is applied, an almost uniform fine current flows in both of A1 and A2, but a leak current of A1 is an order of $10^{-1}$ and a leak current of A2 is an order of about $10^{-9}$, so the leak current of A2 is extremely small and is reduced by more than at least four digits or greater, in comparison to A1.

Further, if a forward bias is applied, a current is increased exponentially in A1, while a current is sharply increased in A2, so the leak current makes an influence. It can be seen that A1 according to the configuration of the present disclosure has a linear portion in a forward bias region and has considerably clean rectifying characteristics in comparison to A2 according to the configuration in which the aluminum oxide film 3 is removed.

In this manner, in the configuration of FIG. 1 according to some embodiments of the present disclosure, the leakage current can be below the detection limit. Further, in the forward bias, good rectifying characteristics in which the voltage and current density has an exponential relationship are shown. Also, although the electron concentration of the n-type ZnO-based semiconductor layer 2 is as low as $1 \times 10^{14}$ $cm^3$, since the Pd layer 4a and the n-type ZnO-based semiconductor layer 2 form a Schottky junction with the aluminum oxide film 3 interposed therebetween, a dark current can be stably suppressed.

FIG. 3 shows the characteristics of spectral responsivity. The horizontal axis indicates wavelength (nm) and the vertical axis indicates quantum efficiency (%). The characteristics of spectral responsivity are measured by irradiating divided monochromic lights to the ZnO-based semiconductor device of FIG. 1 and sweeping the wavelength of the monochromic light. As a light source, a xenon lamp is used and the light intensity at a wavelength of 365 nm is 20 µW/cm². As shown in FIG. 3, the photoresponsivity is under the detection limit in a visible light region, and UV light having a wavelength of 365 nm can be selectively detected.

Next, in the configuration of FIG. 1, capacitance-frequency characteristics (C-V characteristics) are measured. Likewise as above, the substrate 1 is an n type ZnO substrate in which a surface of a stacked side is +C plane, and the n type ZnO-based semiconductor layer 2 is an n-type $(Mg_{0.1}, Zn_{0.9})O$ semiconductor layer (Y=0.1) having an electron concentration of $1 \times 10^{14}$ cm³. The aluminum oxide film 3 is made of $Al_2O_3$ and has a film thickness of 1 nm. Also, in the metal electrode 4, a film thickness of the Pd layer 4a is 4 nm and that of the Au layer 4b is 4 nm.

Figure 4:
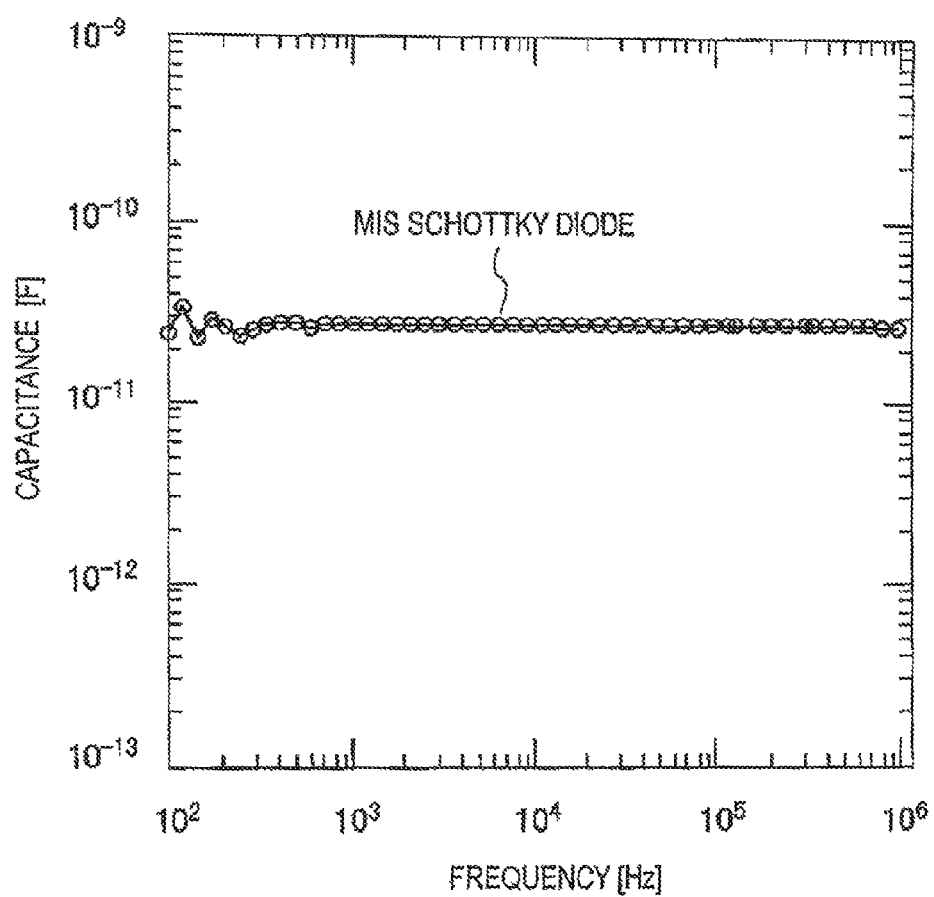
FIG. 4 is a view illustrating capacitance-frequency characteristics of the device of FIG. 1.

Measurement results of the capacitance-frequency characteristics in the MIS Schottky diodes are shown in FIG. 4. The vertical axis indicates a capacitance (F), and the horizontal axis indicates a frequency (Hz). As can be seen from FIG. 4, the capacitance remains constant during sweeping frequency, and there is no frequency dependence. In this manner, it can be seen that the aluminum oxide film 3 and the n type ZnO-based semiconductor layer 2 can be robustly bonded without an interface level.

Figure 5:
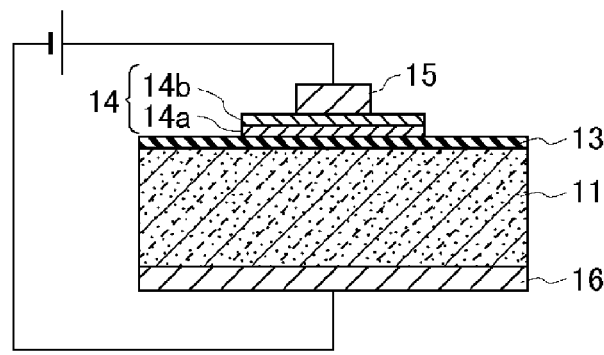
FIG. 5 is a sectional view illustrating a configuration example of a ZnO-based semiconductor device according to another embodiment of the present disclosure.
Figure 6:
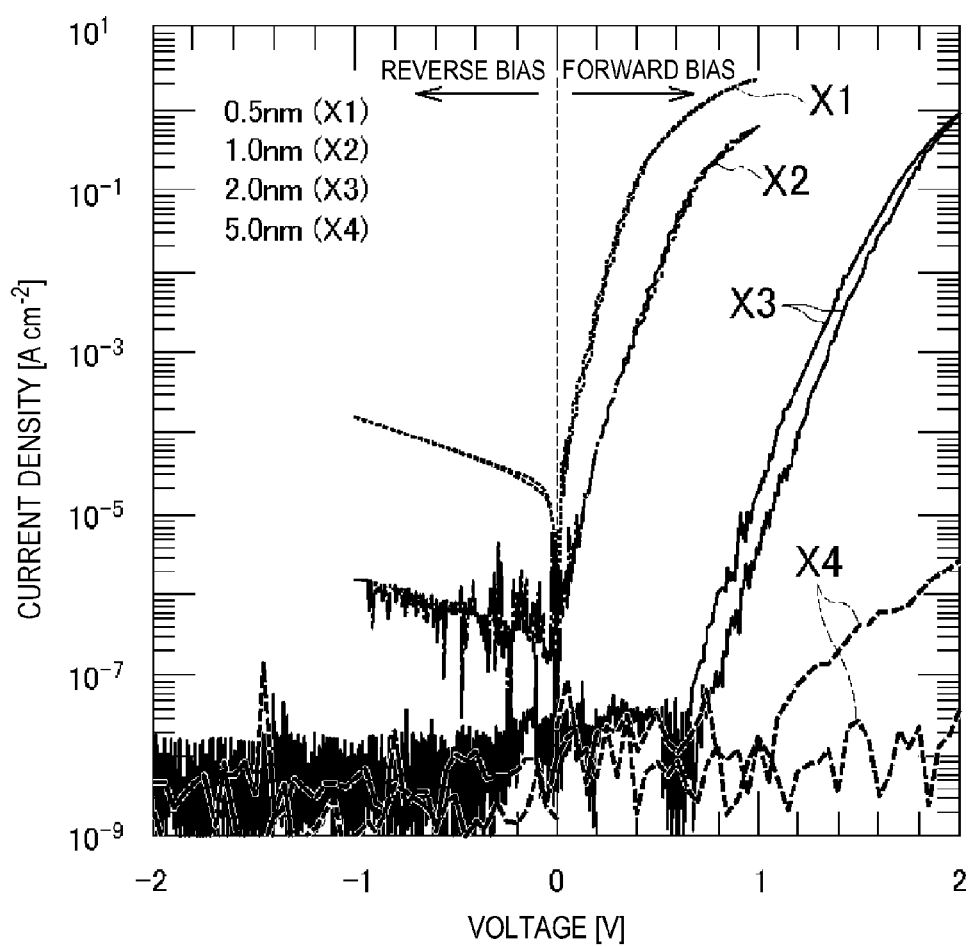
FIG. 6 is a view illustrating current-voltage characteristics when the thickness of an aluminum oxide film is changed in the device of FIG. 5.
Figure 7:
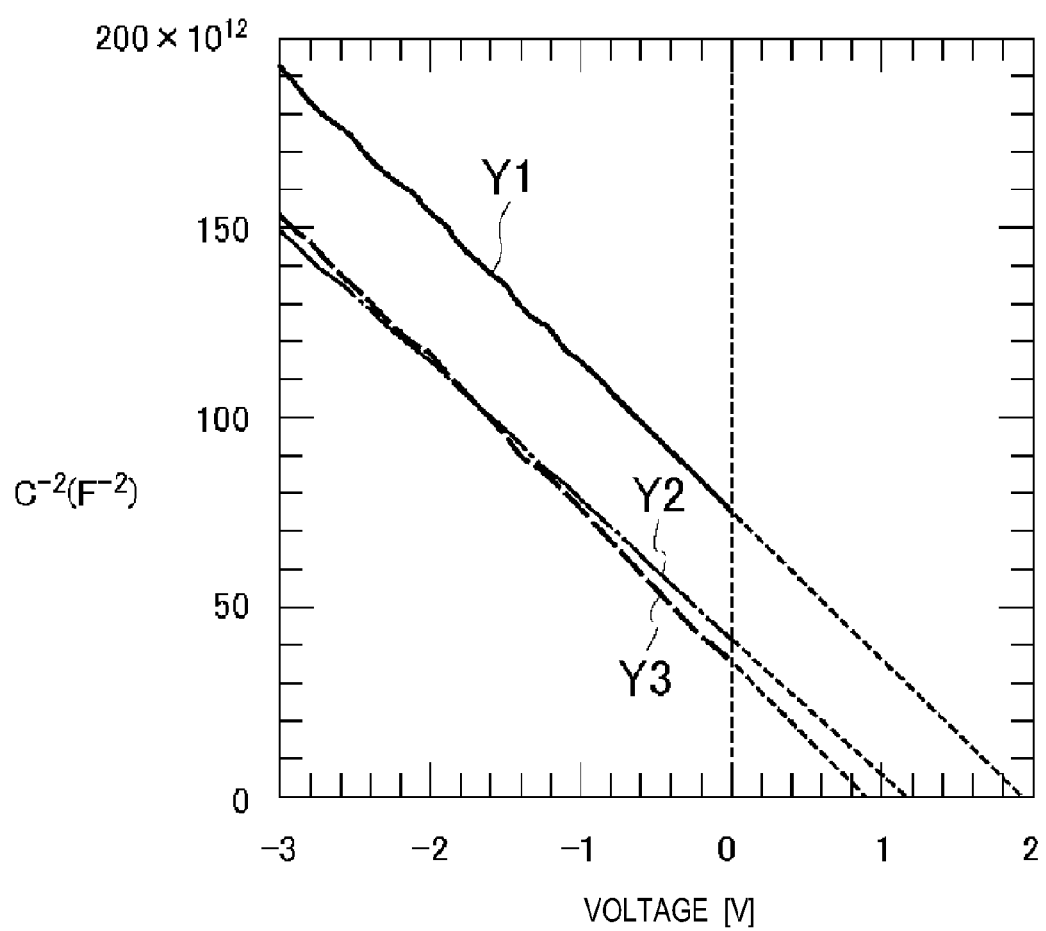
FIG. 7 is a view illustrating $C^{-2}$-V characteristics when the thicknesses of the aluminum oxide film are 0.5 nm, 1.0 nm, and 2.0 nm in the device of FIG. 5.
Figure 8:
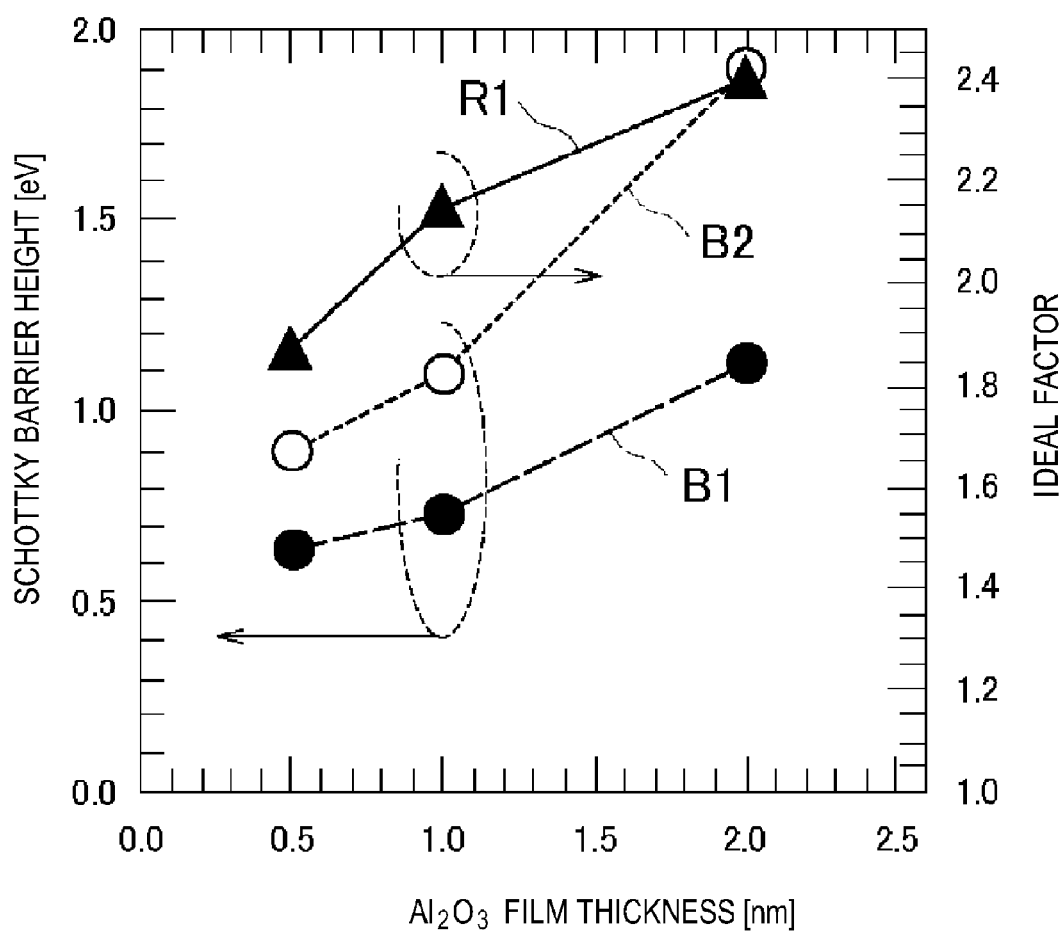
FIG. 8 is a view illustrating a relationship among the thickness of an aluminum oxide film, a height of a Schottky barrier, and an ideal factor in the device of FIG. 5.

Next, FIGS. 6 to 8 show how the characteristics of the ZnO-based semiconductor devices change with the thickness of the $Al_2O_3$ film used as the aluminum oxide film 3. In the measurement of FIGS. 6 to 8, the configuration of FIG. 5 is used. The $Al_2O_3$ film having a thickness L (nm) is formed as an aluminum oxide film 13 on an n type ZnO substrate 11 in which the surface of the stacked side is +C plane. Further, a semi-transparent metal electrode 14 is formed on the aluminum oxide film 13, in which an Au layer 14b having a film thickness of 4 nm is stacked on a Pd layer 14a having a film thickness of 4 nm. A pad electrode 15 having a multilayer film structure of Ni/Au is formed on the metal electrode 14, in which a nickel (Ni) layer and an Au layer are sequentially stacked from below. A rear electrode 16 made of Al is formed on a rear surface of the ZnO substrate 11. Here, the change in the thickness L of the $Al_2O_3$ film is to be measured.

Results obtained by using the semiconductor device of FIG. 5 as mentioned above, are shown in FIG. 6, in which the thickness L of the $Al_2O_3$ film is changed into 0.5 nm, 1.0 nm, 2.0 nm, and 5.0 nm, and current-voltage characteristics in each film with different thickness are measured. Here, the vertical axis indicates current density (A/cm⁻²) and the horizontal axis indicates voltage (V). X1 indicates the case in which the thickness L of the $Al_2O_3$ film is 0.5 nm, X2 indicates the case in which the thickness L of the $Al_2O_3$ film is 1.0 nm, X3 indicates the case in which the thickness L of the $Al_2O_3$ film is 2.0 nm, and X4 indicates the case in which the thickness L of the $Al_2O_3$ film is 5.0 nm.

The case in which the thicknesses of the $Al_2O_3$ film are 0.5 nm, 1.0 nm, and 2.0 nm exhibits rectifying characteristics as can be seen from the curves of X to X3, while in the case of X4, an exponential relationship between the current density and voltage and desired rectifying characteristics are not shown in a forward bias region. As described above, it is considered that a desirable effect is obtained when the thickness of the $Al_2O_3$ film is below around 2.0 nm. The size of the molecules of $Al_2O_3$ is 0.24 nm, so it can be said that a range up to a thickness of about 10 layers of the $Al_2O_3$ monolayer is a desirable range in some embodiments. Thus, the leakage current can be suppressed and the rectifying characteristics can also be maintained by inserting the $Al_2O_3$ film, of which a thickness is so thin that electrons can be tunneled between the Schottky electrode Pd layer and the n-type ZnO.

FIG. 7 shows the results obtained by measuring the capacitance-voltage characteristics ($C^{-2}$-V characteristics) when the thicknesses L of the $Al_2O_3$ film are 0.5 nm, 1.0 nm, and 2.0 nm in the configuration of FIG. 5. Y1 indicates the result in which the thickness L is 0.5 nm, Y2 indicates the result in which the film thickness L is 1.0 nm, and Y3 indicates the result in which the film thickness L is 2.0 nm. If the capacitance of a depletion layer of the semiconductor device of FIG. 5 is set to be C, $C^{-2}$ is calculated and the $C^{-2}$-V characteristics are determined, by obtaining $C^{-2}$-V characteristics in the case where the forward bias voltage V is multiplied.

In FIG. 7, the vertical axis indicates the reciprocal ($1/F^2$) of the square of the capacitance and the horizontal axis indicates voltage (V). As indicated by Y1, Y2, and Y3 in FIG. 7, they have a straight line in a reverse bias region. This means that the internal carrier density of the n-type ZnO substrate 11 of FIG. 5 is uniform in the depth direction.

FIG. 8 shows Schottky barrier heights and an ideal factor when the thicknesses L of the $Al_2O_3$ film are 0.5 nm, 1.0 nm, and 2.0 nm in the semiconductor device of FIG. 5, as mentioned above. In FIG. 8, the horizontal axis indicates thickness (nm) of the $Al_2O_3$ film, the left vertical axis indicates a Schottky barrier height (eV), and the right vertical axis indicates an ideal factor.

Further, B1 indicates a Schottky barrier height derived from the current-voltage characteristics of FIG. 6 when the thicknesses of the $Al_2O_3$ film are 0.5 nm, 1.0 nm, and 2.0 nm. B2 indicates a Schottky barrier height derived from the $C^{-2}$-V characteristics of FIG. 7 when the thicknesses of the $Al_2O_3$ film are 0.5 nm, 1.0 nm, and 2.0 nm. In this manner, as the thickness of the $Al_2O_3$ film is increased, the Schottky barrier height increases and current density decreases.

Meanwhile, R1 indicates an ideal factor in the respective cases in which the thicknesses of the $Al_2O_3$ film are 0.5 nm, 1.0 nm, and 2.0 nm. As can be seen from R1, as the thickness of the $Al_2O_3$ film increases, the ideal factor also increases.

Figure 9:
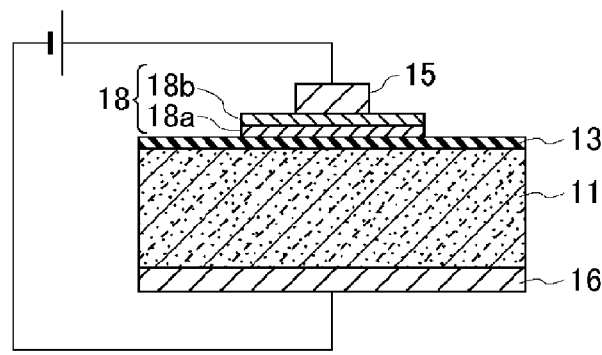
FIG. 9 is a view illustrating the configuration of a Schottky electrode different from that of FIG. 5.

Next, in the ZnO-based semiconductor device of FIGS. 1 and 5, Pd is used as a Schottky electrode, and the superiority of the material will be described as follows. FIG. 9 shows a ZnO-based semiconductor device configured to compare the Schottky electrode, in which the same reference numerals as those of FIG. 5 denote the same components. The Schottky electrodes are different between the ZnO-based semiconductor device of FIG. 9 and that of FIG. 5. The metal electrode 18 of FIG. 9 is composed of a semi-transparent electrode and a multilayer metal obtained by stacking a 4 nm-thick Au layer 18b on a 4 nm-thick Ni layer 18a. That is, the Schottky electrode is the Ni layer 18a.

Figure 10:
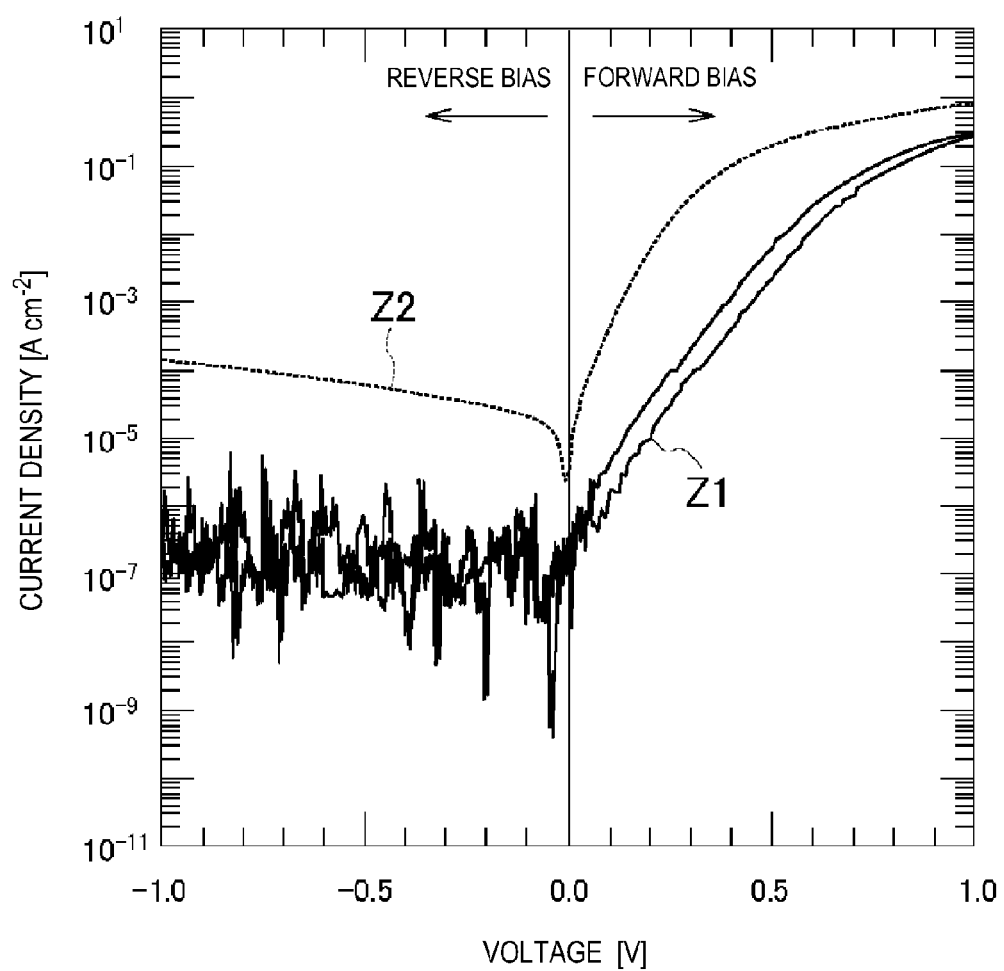
FIG. 10 is a view illustrating current-voltage characteristics in the devices of FIGS. 5 and 9.

Current-voltage characteristics are measured in a state in which light is not irradiated to the ZnO-based semiconductor device of FIG. 5 and that of FIG. 9. The measurement results are shown in FIG. 10. The current-voltage characteristics Z1 of the device of FIG. 5 using Pd in the Schottky electrode show a small leakage current in a reverse bias region and good rectifying characteristics in a forward bias region. However, the current-voltage characteristics Z2 of the device of FIG. 9 using Ni in the Schottky electrode show a large leakage current in the reverse bias region and poor rectifying characteristics in the forward bias region.

Thus, in the Ni metal that can be used in the related art, although the $Al_2O_3$ film is used, it does not result in good effects since the leak current is increased and the rectifying characteristics are deteriorated. In the present disclosure, the Schottky electrode is made of Pd and the aluminum oxide film is formed between the Schottky electrode and the ZnO-based semiconductor, so that the ZnO-based semiconductor device having small leak current and excellent electrical characteristics can be formed.

Next, a method for manufacturing the ZnO-based semiconductor device of FIG. 1 is illustrated in FIGS. 11A to 11G. First, as shown in FIG. 11A, the n type ZnO substrate having a +C plane as a main surface is prepared as the substrate 1 and the surface of the +C is wet-etched by using, for example, a hydrochloric acid solution in which the ratio of hydrochloric acid to water is 7:200 for about 30 seconds. After the surface treatment, an $(Mg_Y, Zn_{1-Y})O$ thin film is epitaxially grown as the n type ZnO semiconductor layer 2 through molecular beam epitaxy (MBE). For example, the $(Mg_Y, Zn_{1-Y})O$ thin film is formed to have a film thickness of 1 µm (FIG. 11B). Further, an n type impurity is doped and a desired electron concentration is set.

Next, as shown in FIG. 11C, the surface of the formed $(Mg_Y, Zn_{1-Y})O$ thin film is ashed and terminated by oxygen. Here, the ashing used in the surface treatment refers to the process of exposing the surface of the $(Mg_Y, Zn_{1-Y})O$ thin film to an oxygen radical O* as an atomic shaped oxygen in an excited state. Gas including oxygen radical may include oxygen plasma, ozone, etc. As for the ashing process, for example, a plasma state is formed by discharging, for example, at an oxygen pressure of 10 Pa (pascal) by power of 10 W, and it is performed for about 30 seconds.

After ashing, the aluminum oxide film 3 is grown from the $(Mg_Y, Zn_{1-Y})O$ thin film through an atomic layer deposition (ALD) method. Here, the ALD is a method of growing the aluminum oxide film 3 by reacting with adsorbed materials on the surface. An OH group and a raw material gas are reacted to form an absorption layer, and when the surface is covered by one layer, the absorption is stopped, and film growing is performed by changing an introduction gas for each step. Accordingly, the aluminum oxide film 3 having a thickness of an integer multiple of a monomolecular layer can be formed.

Thereafter, as shown in FIG. 11E, the Pd layer 4a and the Au layer 4b are sequentially deposited on the aluminum oxide film 3. A diameter S1 of the metal electrode 4 may be, for example, about 350 µm. And then, the pad electrode 5 is formed on the Au layer 4b through deposition. The pad electrode 5 is formed by sequentially stacking a Ni layer and the Au layer through deposition. A diameter S2 of the pad electrode 5 may be about 100 µm. Finally, the rear electrode 6 made of Al, etc., is formed through deposition (FIG. 11G).

Figure 12:
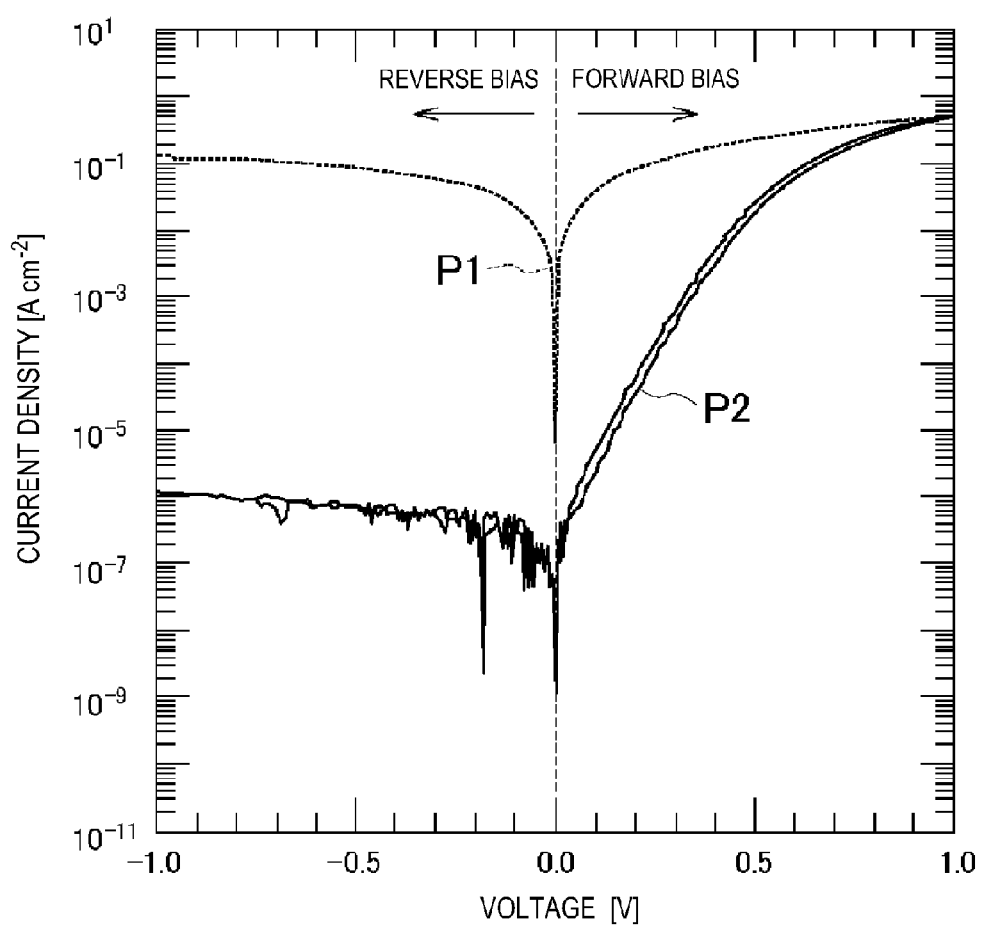
FIG. 12 is a view illustrating current-voltage characteristics when a surface of the ZnO substrate is ashed and current-voltage characteristics when a surface of the ZnO substrate is not ashed based on the configuration of FIG. 5.

An effect obtained by performing ashing in FIG. 11C on the surface of the n-type ZnO substrate 11 is shown in FIG. 12, in which the ZnO-based semiconductor device has the configuration of FIG. 5. In FIG. 12, P2 indicates current-voltage characteristics of the ZnO-based semiconductor device when the aluminum oxide film 13 is grown after the surface of the n type ZnO substrate 11 is ashed. Further, P1 indicates current-voltage characteristics of the ZnO-based semiconductor device in the case where the aluminum oxide film 13 is grown without performing ashing on the surface of the n type ZnO substrate 11. In FIG. 12, the horizontal axis indicates voltage (V) and the vertical axis indicates current density $(A/cm^{-2})$.

If the current-voltage characteristics of P1 and P2 are compared, P2 has about 5 orders of magnitude greater leakage current than P1 in the reverse bias region. Further, in the forward bias region, P2 has better rectifying characteristics. In this manner, the surface of the ZnO-based substrate or the growth side surface of the ZnO-based semiconductor has oxygen-termination through ashing before growing the aluminum oxide film, so that pitholes of the growth side surface can be reduced and the aluminum oxide film can be stably grown, thereby improving the film quality. Thus, the Schottky type ZnO-based semiconductor device having a small leakage current and excellent rectifying characteristics can be manufactured.

Figure 13:
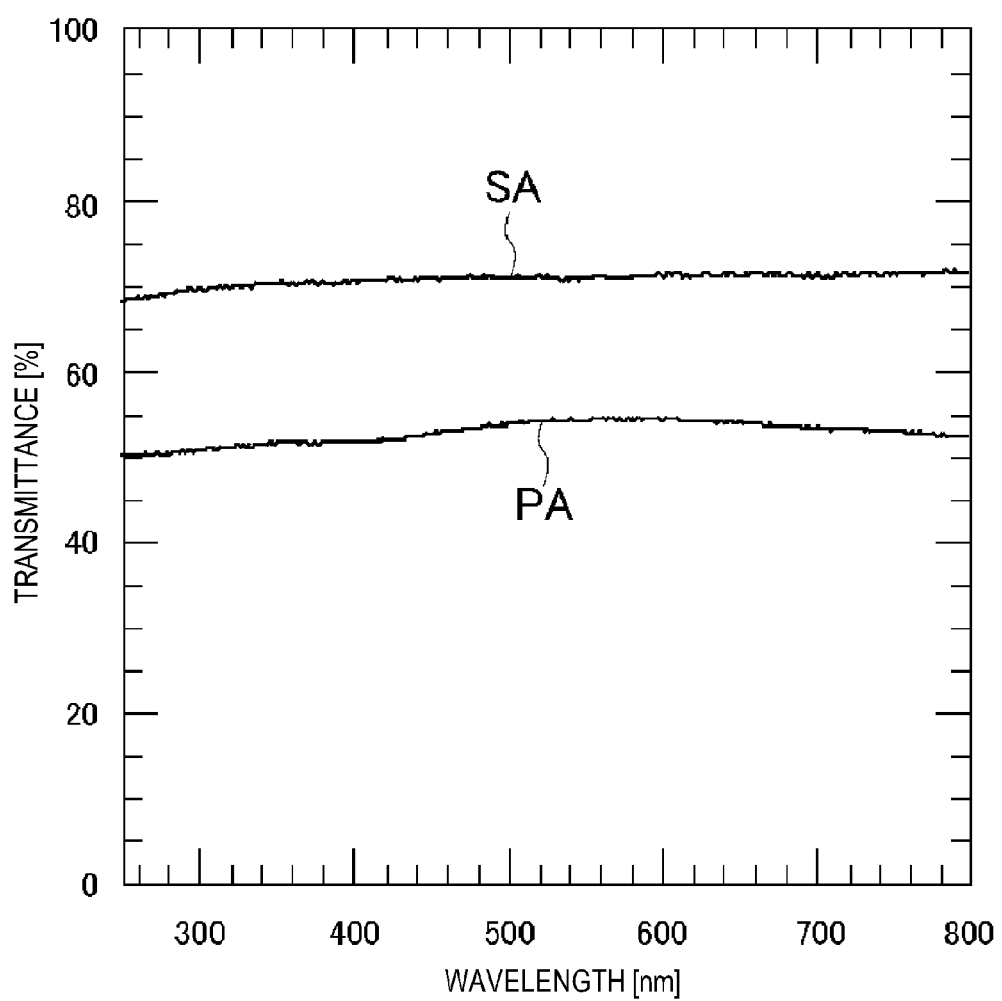
FIG. 13 is a view illustrating a comparison between light transmittance of a sapphire substrate and that of a semitransparent metal electrode of Pd/Au.

FIG. 13 shows a comparison between light transmittance of the semi-transparent metal electrodes 4 and 14 used in the ZnO-based semiconductor device according to some embodiments of the present disclosure and that of a sapphire substrate. The light transmittance of the metal electrodes 4 and 14 is measured by manufacturing a device as follows. An $Al_2O_3$ film having a film thickness of 1 nm is stacked on a sapphire substrate, and a metal electrode is manufactured by sequentially stacking a Pd layer (having a film thickness of 4 nm) and an Au layer (having a film thickness of 4 nm) on the $Al_2O_3$ film, obtaining a structure of the sapphire substrate/$Al_2O_3$ film/Pd/Au. Light transmittance is measured by irradiating light to the device.

As mentioned above, the semi-transparent metal electrodes 4 and 14 are electrodes formed by stacking the Au layer having a film thickness of 4 nm on the Pd layer having a film thickness of 4 nm. In FIG. 13, the horizontal axis indicates wavelength (nm) of light and the vertical axis indicates light transmittance (%). SA indicates a transmittance curve of the sapphire substrate, and PA indicates a transmittance curve of the semi-transparent metal electrodes 4 and 14. Like the transmittance of the sapphire substrate indicated by SA as described above, the PA curve also indicates a certain transmittance in the region of visible light from UV light. However, in comparison to the case in which the transmittance of the sapphire substrate is about 70%, it is illustrated that the transmittance of the semi-transparent electrodes indicated by PA is about 50% and it can be noted that the electrodes are semi-transparent.

Figure 14:
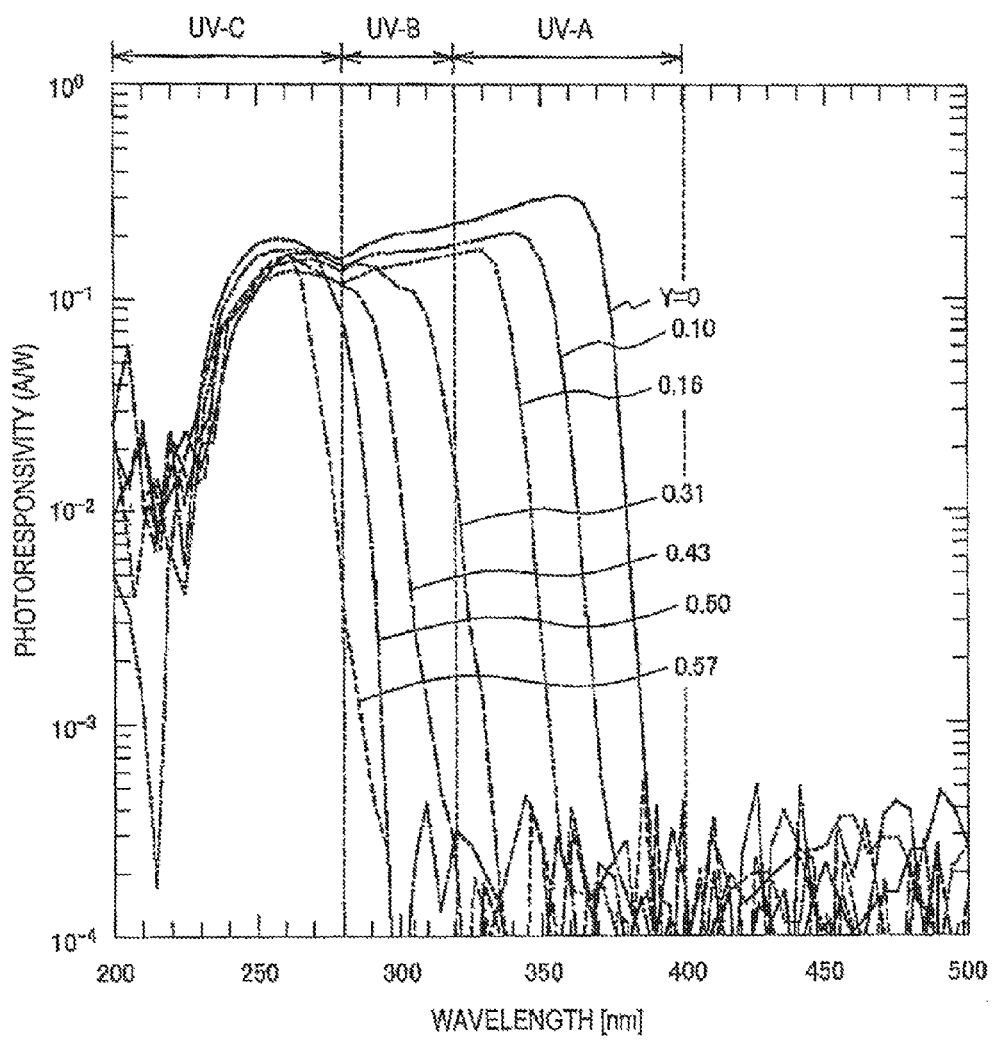
FIG. 14 is a view illustrating characteristics of spectral responsivity of $(Mg_Y, Zn_{1-Y})O$ $(0 \leq Y<1)$.

Meanwhile, FIG. 14 shows that a different UV light region can be detected with different MgO molar fraction Y when using the n-type $(Mg_Y, Zn_{1-Y})O$ $(0 \leq Y < 1)$ in the n-type ZnO-based semiconductor layer 2 of FIG. 1. The characteristics of spectral responsivity are measured by the following configuration. The ZnO-based semiconductor device proposed by the inventors of this application is used. An organic substance electrode, PEDOT:PSS, is formed on an n-type $(Mg_Y, Zn_{1-Y})O$ semiconductor layer, and an Au layer is formed on the PEDOT:PSS. Meanwhile, a rear electrode formed as a multilayer metal film including a Ti layer and an Au layer is formed on the rear surface of the n type $(Mg_Y, Zn_{1-Y})O$ semiconductor layer.

As for a relationship of a band gap-equivalent wavelength (nm) to the MgO molar fraction Y of the $(Mg_Y, Zn_{1-Y})O$, as Y increases, the band gap-equivalent wavelength becomes shorter. FIG. 14 shows the spectral responsivity of different Y. In FIG. 14, the horizontal axis indicates wavelength (nm) and the vertical axis indicates photoresponsivity (A/W).

As can be seen from FIG. 14, an optical responsive wavelength of the Schottky photodiodes can be changed with the MgO molar fraction Y of $(Mg_Y, Zn_{1-Y})O$ as a light absorption layer. Thus, UV light region can be detected by using $(Mg_Y, Zn_{1-Y})O$ layer 2 of FIG. 1, and further, the responsive wavelength can be set, including UV-A, UV-B, and UV-C.

Here, it is assumed that the UV light region refers to a wavelength below 400 nm. The UV light region is further divided into a UV-A (ranging from a wavelength of 320 nm to a wavelength of 400 nm), a UV-B (ranging from a wavelength of 280 nm to a wavelength of 320 nm), and a UV-C (a wavelength of 280 nm or shorter).

According to the ZnO-based semiconductor device of the present disclosure, the n-type ZnO-based semiconductor layer and the palladium layer with the aluminum oxide film interposed therebetween form the Schottky barrier junction. A clean interface at which capacitance is independent of measuring frequency can be obtained. Thus, in comparison to the related art MIS Schottky diode or the like, the leakage current can be reduced and the electrical characteristics can be improved.

Further, according to the method for fabricating a ZnO-based semiconductor device of the present disclosure, the surface of the n type ZnO-based semiconductor layer is exposed to the oxygen radical, before forming the aluminum oxide film. Thus, the surface of the n-type ZnO-based semiconductor layer is terminated by oxygen, improving the junction state of the n-type ZnO-based semiconductor layer and the aluminum oxide film.

According to the present disclosure, the configuration of the ZnO-based semiconductor device can be applied, in particular, to a photodiode or the like for detecting UV light.

While certain embodiments have been described, these embodiments have only been presented by way of example, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A ZnO-based semiconductor device, comprising:
    an n-type ZnO-based semiconductor layer;
    an aluminum oxide film formed on the n-type ZnO-based semiconductor layer; and
    a palladium layer formed on the aluminum oxide film,
    wherein the n-type ZnO-based semiconductor layer, the aluminum oxide film and the palladium layer form a metal insulator semiconductor Schottky barrier junction.

2. The ZnO-based semiconductor device of claim 1, wherein a surface of the n-type ZnO-based semiconductor layer includes a +C plane at the side on which the aluminum oxide film is formed.

3. The ZnO-based semiconductor device of claim 1, wherein the aluminum oxide film has a film thickness of one to ten times the thickness of a monomolecular layer of the aluminum oxide.

4. The ZnO-based semiconductor device of claim 2, wherein the aluminum oxide film has a film thickness of one to ten times the thickness of a monomolecular layer of the aluminum oxide.

5. The ZnO-based semiconductor device of claim 1, wherein a semi-transparent electrode is formed as a multi-layer gold (Au) film including the palladium layer.

6. The ZnO-based semiconductor device of claim 2, wherein a semi-transparent electrode is formed as a multi-layer gold (Au) film including the palladium layer.

7. The ZnO-based semiconductor device of claim 3, wherein a semi-transparent electrode is formed as a multi-layer gold (Au) film including the palladium layer.

8. The ZnO-based semiconductor device of claim 1, wherein the n type ZnO-based semiconductor layer is made of $(Mg_Y, Zn_{1-Y})O$ $(0 \leq Y < 1)$.

9. The ZnO-based semiconductor device of claim 2, wherein the n type ZnO-based semiconductor layer is made of $(Mg_Y, Zn_{1-Y})O$ $(0 \leq Y < 1)$.

10. The ZnO-based semiconductor device of claim 3, wherein the n type ZnO-based semiconductor layer is made of $(Mg_Y, Zn_{1-Y})O$ $(0 \leq Y < 1)$.

11. The ZnO-based semiconductor device of claim 5, wherein the n type ZnO-based semiconductor layer is made of $(Mg_Y, Zn_{1-Y})O$ $(0 \leq Y < 1)$.

12. The ZnO-based semiconductor device of claim 1, wherein the n type ZnO-based semiconductor layer functions as a light absorption layer that absorbs UV light.

13. The ZnO-based semiconductor device of claim 2, wherein the n type ZnO-based semiconductor layer functions as a light absorption layer that absorbs UV light.

14. The ZnO-based semiconductor device of claim 3, wherein the n type ZnO-based semiconductor layer functions as a light absorption layer that absorbs UV light.

15. The ZnO-based semiconductor device of claim 5, wherein the n type ZnO-based semiconductor layer functions as a light absorption layer that absorbs UV light.

16. A manufacturing method of a ZnO-based semiconductor device, the method comprising:
    exposing a surface of an n-type ZnO-based semiconductor layer to an oxide radical to treat the surface;
    forming an aluminum oxide film on the n-type ZnO-based semiconductor layer, after exposing a surface of an n type ZnO-based semiconductor layer; and
    forming a palladium layer on the aluminum oxide film, after forming an aluminum oxide film,
    wherein the n-type ZnO-based semiconductor layer, the aluminum oxide film and the palladium layer form a metal insulator semiconductor Schottky barrier junction.

17. The ZnO-based semiconductor device of claim 16, wherein the aluminum oxide film is grown from the n-type ZnO-based semiconductor layer through an atomic layer deposition.

18. The ZnO-based semiconductor device of claim 17, wherein the aluminum oxide film has a film thickness of one to ten times the thickness of a monomolecular layer of the aluminum oxide.

19. The ZnO-based semiconductor device of claim 16, wherein the n-type ZnO-based semiconductor layer is made of $(Mg_Y, Zn_{1-Y})O$ $(0 \leq Y < 1)$.

* * * * *